United States Patent
Heydari et al.

(10) Patent No.: US 8,474,275 B2
(45) Date of Patent: Jul. 2, 2013

(54) MODULAR ABSORPTION HEAT SINK DEVICES FOR PASSIVE COOLING OF SERVERS AND OTHER ELECTRONICS

(75) Inventors: Ali Heydari, Albany, CA (US); Kenneth C. Gross, San Diego, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/602,407

(22) Filed: Sep. 4, 2012

(65) Prior Publication Data

US 2012/0327590 A1 Dec. 27, 2012

Related U.S. Application Data

(63) Continuation of application No. 12/352,418, filed on Jan. 12, 2009, now Pat. No. 8,276,394.

(51) Int. Cl.
*F25B 15/00* (2006.01)
*F25B 15/16* (2006.01)

(52) U.S. Cl.
USPC .................................. 62/107; 62/109; 62/487

(58) Field of Classification Search
USPC ............... 62/141, 232, 259.2, 107, 109, 487, 62/112, 476; 702/132; 361/688, 689, 690, 361/691, 694, 695, 696, 697
See application file for complete search history.

(56) References Cited

U.S. PATENT DOCUMENTS

| | | | |
|---|---|---|---|
| 6,138,469 A | 10/2000 | Madsen et al. | |
| 6,711,013 B2 | 3/2004 | Wobig et al. | |
| 7,219,714 B1 | 5/2007 | Heydari | |
| 2006/0161375 A1* | 7/2006 | Duberstein et al. | 702/132 |
| 2007/0273024 A1 | 11/2007 | Davidson et al. | |
| 2008/0306704 A1* | 12/2008 | Rockenfeller et al. | 702/132 |

\* cited by examiner

*Primary Examiner* — John F Pettitt
*Assistant Examiner* — Ignacio E Landeros
(74) *Attorney, Agent, or Firm* — Marsh Fischmann & Breyfogle, LLP; Kent A. Lembke

(57) ABSTRACT

A passive heat sink for cooling an electronic component such as a high-performance processor. The heat sink includes a shell with a surface that is positionable adjacent a heat generating surface of the electronic component. The shell includes a heat exchanger portion with cooling fins extending outward and positioned in a fan-provided airflow. A generator compartment is provided within the shell with a generator vessel for containing an absorbent, and the generator compartment is maintained at a pressure lower than ambient. The generator compartment conducts heat away from the electronic component to the absorbent in the generator vessel. An absorber compartment, at a pressure lower than the generator compartment, is provided within the shell above the generator compartment, and, in use, an absorption refrigeration cycle contained within the shell is activated by heat from the electronic component. A bubble pump moves absorbent from the generator compartment to the absorber compartment.

17 Claims, 7 Drawing Sheets

MODULAR ABSORPTION HEAT SINK DEVICES FOR PASSIVE COOLING OF SERVERS AND OTHER ELECTRONICS

CROSS REFERENCE TO RELATED APPLICATIONS

This application is a continuation of U.S. patent application Ser. No. 12/352,418, filed Jan. 12, 2009, which is incorporated by reference herein in its entirety.

BACKGROUND

1. Field of the Description

The present invention relates, in general, to methods and systems for cooling electronic components such as processors in servers and other computing devices, and, more particularly, to an enhanced heat sink assembly or device that can be attached to a heat generating surface of electronic components such as a processor to provide cooling based on the absorption refrigeration cycle in a passive manner, e.g., without use of compressors and motorized pumps.

2. Relevant Background

Removal of heat has become one of the most important challenges facing computer designers as failure to adequately cool devices can cause failure or operating problems. The rate of power dissipation from electronic components such as from processors (or CPUs) in high-performance server units continues to increase. For example, in servers and disk storage systems, the heat load per product footprint (or Watts/square feet) has grown from 200 to 300 W/ft$^2$ to 1700 to 1900 W/ft$^2$ in the past 18 years. Cooling technology has not been able to match this rapid pace of heat generation, and standard conduction and forced-air convection air cooling techniques are encountering fundamental limits in their ability to provide adequate cooling for such sophisticated electronic components. The reliability of an electronic system may suffer if high temperatures at hot spot locations are permitted to exist, e.g., a heat generating surface of a CPU or the like.

A typical cooling arrangement for a computer device such as a server will include a heat sink mounted such that its base is in heat conducting contact with an external surface of an electronic component. Fins extend up from the base and one or more fans are used to force cooling air to flow between the fins to eject heat from the heat sink and the component upon which the heat sink is mounted. Unfortunately, conventional thermal control schemes such as air cooling with fans and heat sinks and other cooling designs including thermoelectric cooling, heat pipes, and passive vapor chambers have either reached their practical application limits or are soon to become impractical for high-power electronic components such as for use in computer server units. For example, a conventional heat sink is limited by the space available to provide heat transfer fins and the number of fins and/or spacing may be limited by the amount of pressure drop that can be supported by the fans.

When standard cooling methods are no longer adequate, computer manufacturers are sometimes forced to reduce the speed of their processors to generate less heat so as to match power dissipation with the capacity of the available cooling devices. In other cases, computers are provided that are less reliable due to inadequate cooling. Manufacturers of electronic devices may also have to delay release of their new designs or products until a reliable cooling apparatus for removal of the heat from high heat dissipating electronic components is available for use. Additionally, thermal management of high heat flux server units necessitates the use of bulky fan and heat sink assembly units, which have limited the ability of computer server manufacturers to adequately increase the capacity of their systems due to imposed heat removal and space limitations.

The computer industry, in particular, is seriously challenged with thermal management of their high-performance and high-power electronic components. A number of attempts have been made to provide enhanced heat removal but none has been wholly successful. For example, attempts have been made to provide improved thermal paths (e.g., heat transfer paths) by reducing thermal resistance such as between a heat generating surface of a processor and heat transfer fins of a heat sink. Such designs of low thermal resistance have been used most often with fan-driven cooling air systems to try to maintain the junction between the heat sink and electronic component surface within an acceptable range such as 80 to 100° C. or the like (e.g., a few degrees above or below a desired operating temperature such as 85° C., 95° C., and so on). The electronic components may be high heat flux electronic components such as CPUs, ASICs, DIMMs, and the like. To date, the ever-increasing demand for processing speed is pushing the envelope of thermal management beyond what is attainable using traditional air cooling systems.

A major obstacle in efficient thermal management of high power computer servers, for example, is the presence of hot spots on the electronic components and inability of air cooling schemes in effectively removing heat from its point of generation. Additionally, reports indicate that in most data centers, over sixty percent of the overall data center energy demand is associated with cooling the information technology (IT) equipment. Moreover, it has been estimated that about seventy percent of the cost of managing servers in data centers is related to power and cooling and only twenty to thirty percent being related to the cost of the IT equipment itself. Therefore, designing a cooling system that effectively manages the thermal load with reliable performance and with reduced power consumption would represent a major breakthrough in the design of high performance servers.

There remains a need for improved methods and devices for removing heat from electronic components such as CPUs and the like. Preferably, such devices would require the same or less power than existing devices, would provide reliable service over the life of the electronic components, and would be sized and configured to fit within the footprint and/or size constrained spaces of today's and tomorrow's computing and other electronic devices.

SUMMARY

Briefly, the above and other issues with cooling of electronic components such as processors are addressed by providing enhanced heat sink devices. The heat sink devices may be mated with processors and other heat generating components similar to prior conventional heat sink devices but are different in that they include components to provide a contained and passive refrigeration cycle. Particularly, each heat sink device includes a shell or housing with two low pressure compartments or vessels providing a generator and an absorber. An absorbent or working absorbing fluid is provided and two or more passive pumps such as bubble pumps are provided to connect the generator and absorber (with the generator portion having two heat exchanges of "generator" and "condenser" and the absorber portion having two heat exchanges of "absorber" and "evaporator"). The components further include one or more heat exchanger components to transfer heat from the working fluid to cooling air flowing over the outer surfaces of the heat sink. In this manner, the heat sink provides an absorption refrigeration cycle that is activated with heat from a mating surface of an electronic component such as a processor.

The use of absorption heat sink devices to cool electronic components provides a number of advantages in the areas of thermal management and design, in manufacturing, in reliability, and in cost. Regarding thermal management and design, it is believed that incorporating the absorption refrigeration technology in the form of a passive heat sink device represents one of the widest ranges of thermal management schemes recently developed in the electronics industry for flexible, passive cooling of electronics components (such as components in a data center that may be generating differing amounts of heat and can be served by different capacity heat sink devices). The differing sized or capacity heat sinks are ideally suited for integration with selective provisioning tools such as CSTH or other telemetry products provided in a computer system to provide intelligent provisioning of workload to differing heat flux components that are cooled by appropriate heat sinks (e.g., that have refrigeration cycles effectively actuated with the waste heat of the matched processor or electronics component), which is particularly useful for achieving improved overall efficiency in servers and other computing devices with dynamically varying workload demands. With regard to manufacturing, as opposed to applications of active cooling system, utilizing absorption refrigeration cooling in the body or shell of a heat sink device provides an efficient and flexible design that facilitates manufacturing of the heat sinks and also the manufacture of high heat flux components, such as high-performance processors for servers and other applications, that can be cooled with the heat sink devices. With regard to reliability, the absorption heat sinks are effective in minimizing the hot regions inside of a server box or other electronics product, and this increases the reliability of the electronic components in use or in the field. Passive, absorption heat sinks integrated with computer server internal components, for example, do not have mechanical pumps or compressors that could possible wear out or break down. With regard to cost, using the passive heat sinks with contained absorption refrigeration cycle systems provides an opportunity for drastically reducing the cost of thermal management such as for servers in data centers and the like. Costs are reduced in part because the cooling system works on the basis of converting waste heat generated by the high-heat and high-power processors and electronic components in the servers into the energy required to activate or provide the needed cooling at the junction between the component and the heat sink (e.g., the heat transmitted from one or more high temperature surfaces of an electronic component is used to heat the absorbent or working absorbing fluid and activate/drive the absorption cooling cycle in the heat sink and no other power is required to maintain the junction temperature within a desired temperature range).

More particularly, a passive heat sink is provided for use with a fan(s) for cooling an electronic component such as a high-performance processor. The heat sink includes a shell with a heat transfer surface that is mounted adjacent or in heat transfer-contact with a heat generating surface of the electronic component. The shell also includes a heat exchanger portion (e.g., a plurality of cooling fins extending outward from the shell's outer surface) that is spaced apart or opposite in some cases from the heat transfer surface of the shell and, during use, is positioned in an airflow provided by the fan(s). A generator compartment is provided within the shell with a generator vessel for containing a volume of absorbent/working absorbing fluid (such as a concentrated solution of water and salt), and the generator compartment may be configured to maintain a pressure that is lower than ambient. The generator compartment also includes a heat conductive path between the heat transfer surface (which abuts the electronic component or a TIM between the shell and the component's heat generating surface) and the generator vessel such that the heat received from the electronic component is transferred to the absorbent. The "path" may simply be a shared wall of the shell.

The heat sink further includes an absorber compartment within the shell that is positioned above (when the heat sink is installed over/on an electronic component) or adjacent the generator compartment, and, in use, an absorption refrigeration cycle operates within the shell when a predefined quantity of heat is provided to the heat transfer surface of the shell. The absorber compartment is configured to maintain a pressure below that of the generator compartment (e.g., a 10:1 ratio or the like, with both pressures being sub-atmospheric). The heat sink also includes a bubble pump with an inlet in the generator vessel and an outlet in the absorber compartment to transfer heated absorbent upward using buoyancy to a heat exchanger portion of the shell, and a return line connects the absorber compartment and the generator compartment to return a diluted volume/portion of the absorbent to the generator vessel. The heat sink also includes a condenser portion in the generator compartment of the shell that includes a condenser air cooler in the heat exchanger portion of the shell and a condenser vessel for receiving a volume of condensate of the absorbent by gravity feed from the condenser air cooler. A bubble pump is also provided with an inlet in the condenser vessel and an outlet in the absorber compartment in an evaporator air cooler portion of the heat exchanger. The generator portion may have two heat exchanges (e.g., generator and condenser) as may have the absorber portion (e.g., absorber and evaporator).

In operation, the condensate that moves from the condenser to the evaporator heat exchanger vaporizes, and the vapor is then condensed in the dilute absorbent to be pumped back to the generator using the bubble pump. Typically, there are two pumps used to move the concentrate and dilute absorbent solutions to and from the absorber. The change in phase happens both due to change in pressure as well as movement of air through the condenser and evaporator heat exchangers. Therefore, heat absorbed in the absorber is dissipated to the air through the heat exchanger fins of the heat sink unit.

DETAILED DESCRIPTION

Figure 1:
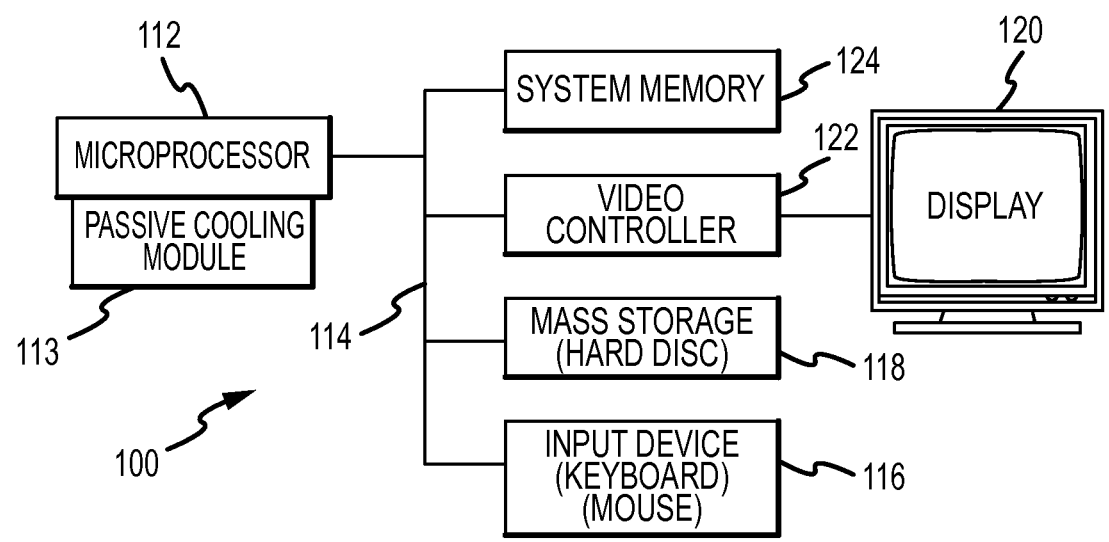
FIG. 1 illustrates a functional block diagram of a computer system or network configured to operate with thermal management according to an embodiment of the invention with a passive cooling module.

Briefly, embodiments of the present invention are directed to methods and systems for addressing the computer industry's challenge to provide thermal management of high-performance and high-power electronic components. The thermal management systems generally include a heat-activated absorption heat sink device that may be attached in heat conducting contact with one or more heat generation surface of such an electronic component (e.g., a CPU or the like). The heat sink device acts passively (i.e., without a compressor, motorized pumps, and the like) to reduce the electronic component's temperature to a design temperature level (e.g., 85 to 95° C. or the like) to facilitate a reliable performance of the system (e.g., a server box) for its designated life. The heat sink device may be designed to be modular and, in some cases, field removable such that it may be placed with its heat exchanger surfaces (e.g., heat transfer or sink fins) in the flow path of cooling airflow provided inside the system or server box through the use of one or more fans.

The heat sink device is also placed against or over the heat generating electronic component(s) such as a high-power processor, and the heat sink device is a unitary device that removes heat from the electronic component using an absorption refrigeration cycle with the heat generating surface of the electronic component providing the heat to activate the cycle. The heat sink device is also typically unitary with the components or elements for the refrigeration cycle being provided within the housing or body of the device in a generator compartment and an absorber compartment (e.g., two compartments or vessels kept at two differing pressures such as a high and low pressure side, respectively, of the device, and with the generator portion having two heat exchanges including "generator" and "condenser" and the absorber portion having two heat exchanges including "absorber" and "evaporator"). Bubble pumps may be used to transfer working fluid or vapor from the generator compartment to the absorber compartment to eliminate the need for motorized pumps and/or compressors. These miniaturized absorption heat sinks are able to remove heat from small junction locations between the heat sink device and the surface(s) of the electronic component, and, in operation, much lower air flow is needed to provide higher levels of cooling or heat removal. Hence, oversized heat sinks (or heat transfer surface areas) are not required and higher capacity or greater numbered cooling fans are not required, thus saving costs on components and power as well as providing a smaller footprint cooling apparatus for computers and other electronic products. The following description begins with an overview of computer systems and devices that may implement heat sinks of the invention and then proceeds to describe several more specific embodiments of unitary absorption heat sink devices useful for providing enhanced thermal management.

As discussed in the background, thermal management is required for many electronic components and devices/systems using such systems. For example, but not as a limitation, the electronic component may be a high performance CPU or similar component for a computer or computing device such as a server or data storage computer system. For purposes of this disclosure, an information handling or computer system/device may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, a computer system or electronics device/product may be a personal computer, a network storage device, or any other suitable device and may vary in size, shape, performance, functionality, and price. The computer system may include random access memory (RAM), one or more processing resources such as a central processing unit (CPU) or hardware or software control logic, ROM, and/or other types of nonvolatile memory, and the CPU and/or other electronic components may be adapted for passive cooling with a heat sink(s) of the present invention. Additional components of the system may include one or more disk drives, one or more network ports for communicating with external devices as well as various input and output (I/O) devices, such as a keyboard, a mouse, and a video display. The computer system may also include one or more buses operable to transmit communications between the various hardware components.

In one embodiment, thermal management is provided with absorption cooling modules as shown in FIG. 1. A computer system 100 may include a microprocessor or CPU 112, which is connected to a bus 114, and the bus 114 serves as a connection between CPU 112 and other components of computer system 100. Significantly, the CPU 112 may be an electronic component that generates heat at a rate that is difficult to manage or dissipate using a conventional heat sink or other heat transfer scheme. Instead, a passive cooling module 113 as described herein is mounted on or over the CPU 112 such as on a heat transfer surface of the module 113. The heat transfer surface of the module 113 may be a surface adjacent (or with a heat transfer path to) a generator compartment of the module 113 to provide activating heat (e.g., heat to transform working fluid to vapor) from the CPU 112 for an absorption refrigeration cycle provided within the module 113 (e.g., with heat removed from a heat exchanger portion in/proximate to the absorption compartment of the module by flowing cool air in system 100 such as with one or more fans (not shown)). In this manner, the CPU 112 of system 100 is kept at a design level or within a desired operating temperature range with the use of passive cooling module 113.

The system 100 may include additional components, with such components also cooled with modules 113 or through other cooling methods as appropriate. As shown, an input device 116 is coupled to microprocessor 112 to provide input to microprocessor 112. Examples of input devices include keyboards, touchscreens, and pointing devices such as mouses, trackballs and trackpads. Programs and data are stored on a mass storage device 118, which is coupled to microprocessor 112. Mass storage devices 118 may include such devices as hard disks, optical disks, magneto-optical drives, floppy drives and the like. Computer system 100 further includes a display 120, which is coupled to microprocessor 112 by a video controller 122. A system memory 124 is coupled to microprocessor 112 to provide the microprocessor 112 with fast storage to facilitate execution of computer programs by microprocessor 112. It should be understood that other busses and intermediate circuits may be deployed between the components described above and microprocessor 112 to facilitate interconnection between the components and the microprocessor 112, and, further, thermal management may be provided by any of the embodiments shown and/or described below.

Figure 2:
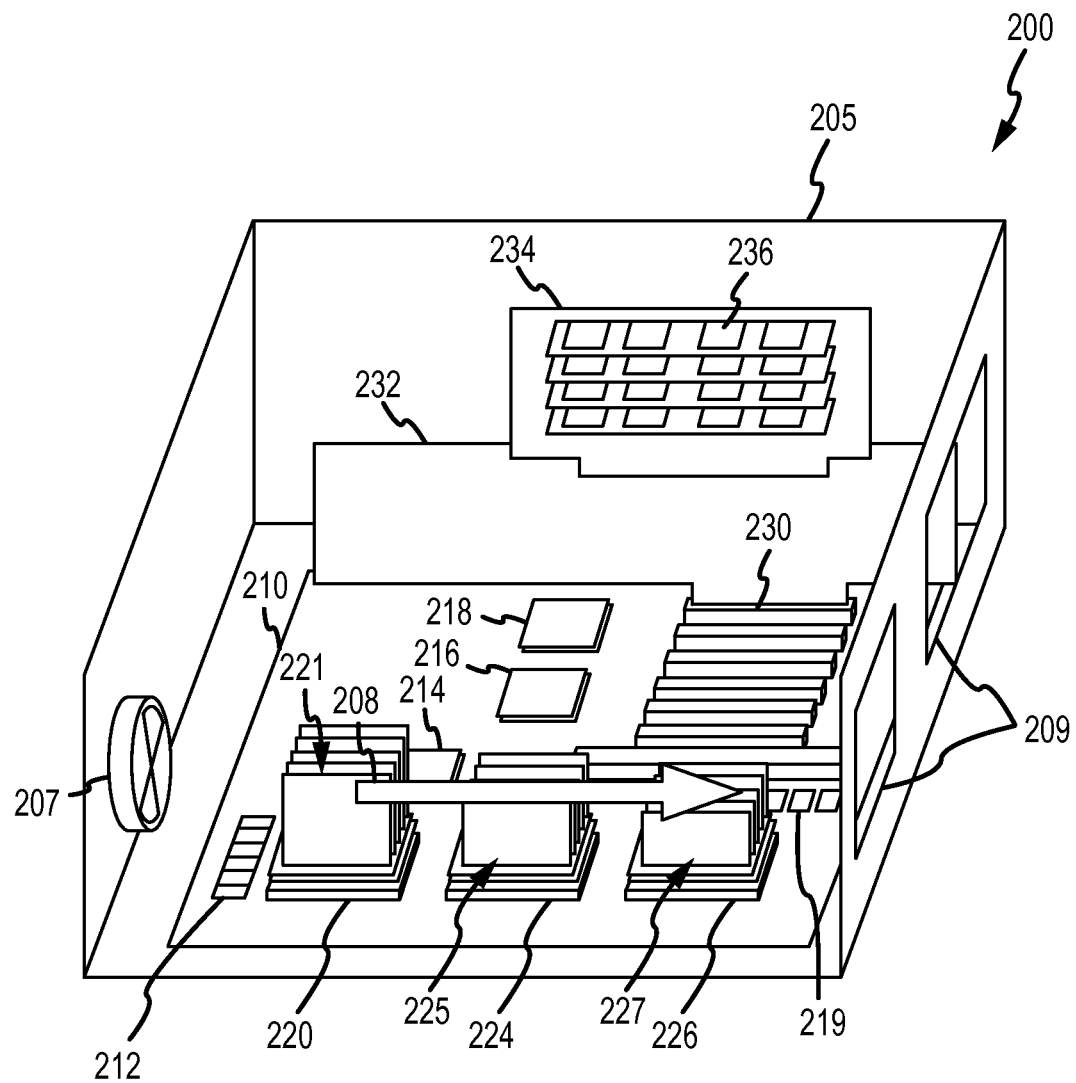
FIG. 2 is a perspective view of a computing device such as a server with a pair of walls removed to show use of modular absorption heat sink devices according to an embodiment of the invention to remove heat from electronic components (e.g., processors)

FIG. 2 illustrates a computer device such as a server 200 configured to provide cooling according to an embodiment of the invention. As shown, a housing or box 205 is provided for physically enclosing and supporting a number of electronic components of the server 200. To provide cooling air flow within the server box 205, a fan 207 is mounted on one wall to draw outside air into the box interior and cause this air to flow as shown at 208 over the internally mounted components of server 200. After the cooling air has accepted a quantity of heat from the components, the air 208 is output through air vents/outlets 209 in a wall of the box 205. Main circuit components of the server 200 are mounted upon a system board 210, which itself is mounted on chassis or box 205.

The server 200 may include numerous components such as a power source, a disk and other media drives, CPUs, and the like. As shown, the server 200 includes three processors 220, 224, 226 mounted on the board 210 (e.g., directly, through sockets on board 210, and the like). Additionally, other components 212, 214, 216, 218, 219, 230, 232, 234, and 236 are provided in box or chassis 205. The components may include termination circuits 212, 219, a memory controller 214, bridges 216, 218, connectors 230 (e.g., PCI connectors or the like), an expansion board 232 (e.g., a PCI expansion board or the like), memory board 234 (shown prior to insertion into a connector 230 or memory slot on board 210) on which memory modules 236 are provided/mounted, and so on to provide desired functionality for server 200.

Significantly, the processors 220, 224, 226 are passively cooled with their heat effectively dissipated or ejected to cooling airflow 208. As shown, a unitary absorption heat sink device 221, 225, 227 is mounted on or over each of the processors 220, 224, 226. The processors 220, 224, 226 may be high performance and/or high capacity processors that are mounted with a heat generating surface facing upward or into the interior of the box 205. The heat sink devices 221, 225, 227 are attached such that their generator compartments (as explained below) abut this surface, which may have hot spots, such that heat is transferred from the processors 220, 224, 226 to the heat sink devices 221, 225, 227 when the processors are operated or loaded. The heat sinks 221, 225, 227 include heat exchangers with fins through which the cooling air 208 flows to eject heat from the heat sinks 221, 225, 227.

In one embodiment, the processors 220, 224, 226 are not identical but instead may be thought of as being first, second, and third configurations associated with differing heat flux characteristics (e.g., low, medium, and high heat dissipation during operation). To maintain these differing devices in a desired temperature range at the junction with the heat sinks, the heat sinks 221, 225, 227 may also be of differing designs such as a first design adapted to be efficient over lower heat flux or transfer ranges, a second design adapted to be efficient over medium heat flux or transfer ranges, and a third design adapted to be efficient over high heat flux or transfer ranges. These heat sinks 221, 225, 227 are then mounted on the component with a corresponding or matching heat dissipation requirement. In other words, each of the heat sinks 221, 225, 227 may be adapted for being activated by a predefined quantity of heat input from an electronic component and to operate at highest efficiencies when the input or heat ejected from the component is within a particular heat flux range, and experimentation may be performed to identify heat dissipation (or activation heat available) from an electronic component (such as processor or the like) for use in selecting a preferred heat sink 221, 225, 227. The heat removal capacity of a heat sink 221, 225, 227 may be set by sizing the fins or configuration of the heat exchanger or by altering one or more other design characteristics such as working fluid, working fluid volume, size and arrangement of generator compartment, size and arrangement of absorber compartment, and the like, as will be better understood based on the following description of particular heat sink devices.

Figure 3:
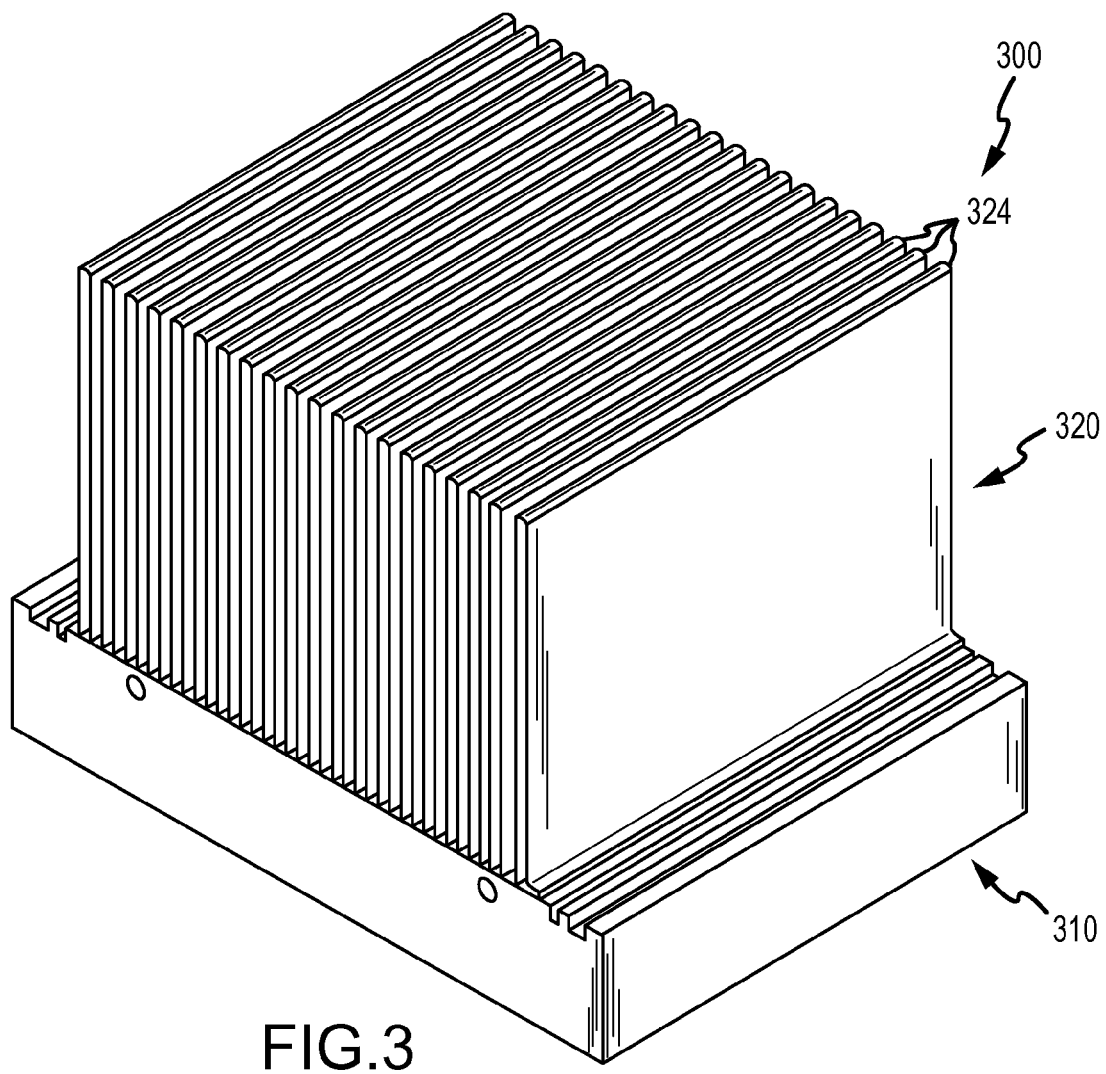
FIG. 3 is a perspective view of one embodiment of a passive absorption heat sink assembly of the invention as may be used in the systems of FIGS. 1 and 2 to provide enhanced heat removal from a heat generating surface of an electronic component.

FIG. 3 illustrates an embodiment of an absorption heat sink assembly 300 that may be used to provide passive thermal management of electronic devices. For example, the assembly 300 may be utilized as the passive cooling module 113 of FIG. 1 or as the heat sink devices 221, 225, 227 of FIG. 2. The assembly 300 is unitary and modular. Modular in this context means that it can be mounted and removed as a module upon electronic components, such as in electronic products previously designed for receiving a conventional heat sink. Unitary in this context means that the assembly 300 includes all the components and elements needed to provide an absorption refrigeration cycle (except for cooling airflow). As shown, the assembly 300 includes a base or generator portion 310 that is used to mount the assembly 300 on or over an electronic component such as with a heat transfer surface (hidden from view in Figure but typically the underside of base 310) in contact with the heat generating surface of the electronic component. The base portion 310 includes or houses a generator compartment that contains a volume of working absorbing fluid adjacent or near the wall with the heat transfer surface to facilitate transfer/receipt of activation heat from the electronic component. The assembly 300 also includes a heat exchanger portion 320 with a plurality of spaced apart cooling fins 324. Also, the heat exchanger portion 320 includes an absorber compartment (not shown) within and mating with the fins 324, with the operation of the absorber compartment described in more detail below.

Figure 4:
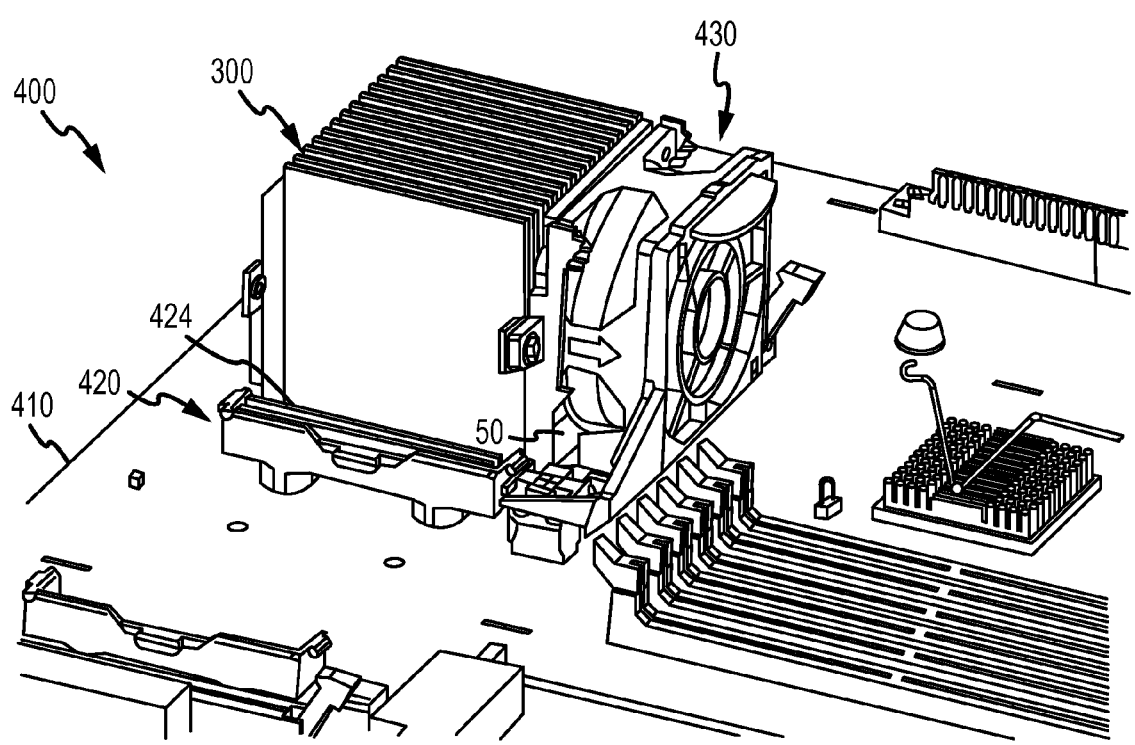
FIG. 4 is a partial perspective view of a computer or server showing a heat sink and fan assembly (e.g., the heat sink assembly of FIG. 3 combined with a fan) after mounting to a board with heat conducting contact with an electronic component.

The heat sink assembly 300 may be mounted in an electronics product (such as a server) 400 shown in FIG. 4. As shown, the electronics product 400 includes a board 410 on which a number of electronic components are mounted. Particularly, the product 400 includes an electronic component 420 mounted on the board 410, and the component 420 may require thermal management to dissipate a particular quantity of heat during its operation. To this end, the heat sink assembly 300 is mounted over the electronic component 420 such that the two devices abut at a heat transfer (or thermal interface) junction 424. Heat transferred from component 420 is used to activate an absorption refrigeration cycle in the assembly 300, and heat is removed from the assembly 300 by cooling air. The cooling air in this embodiment 400 is drawn through the cooling fins 324 of the assembly 300 via a cooling fan 430 that is mounted immediately adjacent (in this exemplary but not limiting embodiment) on the board 410. Of course, many other physical arrangements will become clear to those skilled in the art based on the embodiments shown and suggested herein, and these other arrangements are considered within the breadth of this description.

Figure 5:
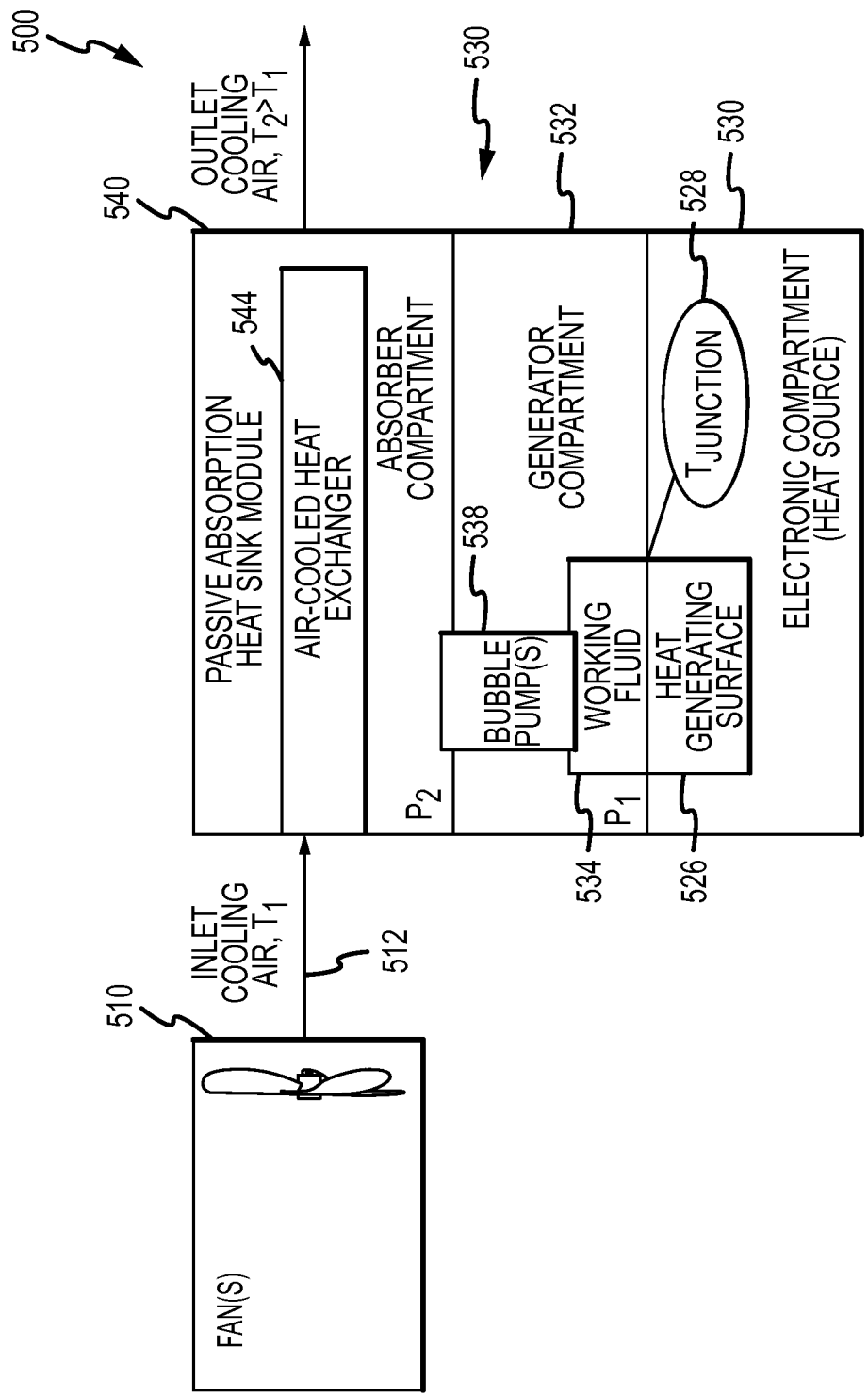
FIG. 5 is a functional block diagram of a passive cooling assembly of the invention placed in abutting contact with a heat generating surface of an electronic component.

FIG. 5 illustrates schematically a thermal management system 500 using an absorption heat sink assembly 500 to remove heat at a desired rate. As shown, one or more fans 510 are provided to generate a volume of cooling or inlet air 512. The rate and quantity of air flow 512 may be varied to practice the invention, but generally the inlet cooling air 512 is provided at a first temperature, $T_1$, that is significantly lower than the temperature of surfaces of an air cooled heat exchanger 544 such that heat is transferred out of the assembly 530 to outlet cooling air, which has a higher temperature, $T_2$. The heat exchanger 544 may take a number of forms such as, but not limited to, spaced apart fins extending upward from a base (as shown, for example, in FIG. 3). The heat sink assembly 530 is used to provide cooling for an electronic component (or activation or heat source) 520. The component 520 includes a heat generating or dissipation surface 526, which may have fairly uniform temperatures, $T_{junction}$, (as may be measured by a sensor connected to or provided in a telemetry harness or other monitoring system), or may have one or more hot spots as is the case with many CPU designs. The assembly 530 is positioned near the component 520 such that the heat generating surface 526 abuts a generator compartment 532.

According to one aspect of the embodiment 530 shown in FIG. 5, the assembly 530 includes two compartments, i.e., a generator compartment 532 and an absorber compartment 540. The generator compartment 532 is maintained at a lower pressure, $P_1$, that is typically below ambient (or sub-atmospheric), and the compartment 532 may include walls that enclose an internal volume or space in which a volume of a working absorbing fluid 534 is provided. The working absorbing fluid 534 is positioned such that heat transferred from the hot surface 526 of component 520 heats the working absorbing fluid 534 and activates an absorption refrigeration cycle in assembly 530. One or more bubble pumps 538 are provided to transfer working fluid from the generator compartment 532 to the absorber compartment 540 (e.g., a pump that in general raises the working absorbing fluid, that has been heated by the activation or received heat from the electronic component surface 526, by introducing bubbles (e.g., working fluid vapor or the like) into an outlet tube extending from the generator compartment 532 to the absorber compartment 540).

The absorber compartment 540 is positioned above the generator compartment 532 to receive the rising working fluid 534, and it includes walls to form an enclosed volume or space that is maintained at a pressure, $P_2$, that is also below ambient and is generally significantly lower than the generator compartment pressure, $P_1$ (e.g., a lower sub-atmospheric pressure than $P_1$ such as at a significantly large pressure ratio such as of about 10:1 ($P_1:P_2$) but a smaller or greater ratio may be used to suit a particular design). Heat is removed from the working absorbing fluid 534 in the absorber compartment 540 via cooling air flowing through the air-cooled heat exchanger 544 (e.g., fins with air flowing near an external surface and working fluid flowing near an internal surface), and, in this manner, heat from the component surface 526 is effectively ejected with the system 500.

The assembly 530 provides a miniature, unitary device for providing cooling to an electronic device 520 such as a processor using the absorption refrigeration cycle. Generally, as shown, the assembly 530 includes one or more vessels/shells for providing an absorber 540, a concentrator or generator 532, and a pump 538 (e.g., no compressor is required). The working absorbing fluid or absorbent 534 may take nearly any useful form such as water with a salt such as lithium bromide mixed to form an absorbing solution (e.g., an adequate amount of salt to provide a concentrated absorbent). The heat source for the cycle is provided by the electronic component 520 and its heat generating surface 526 (e.g., a surface of a CPU or other electronic component), and the heat source produces a pressure difference within the assembly 530.

Figure 6:
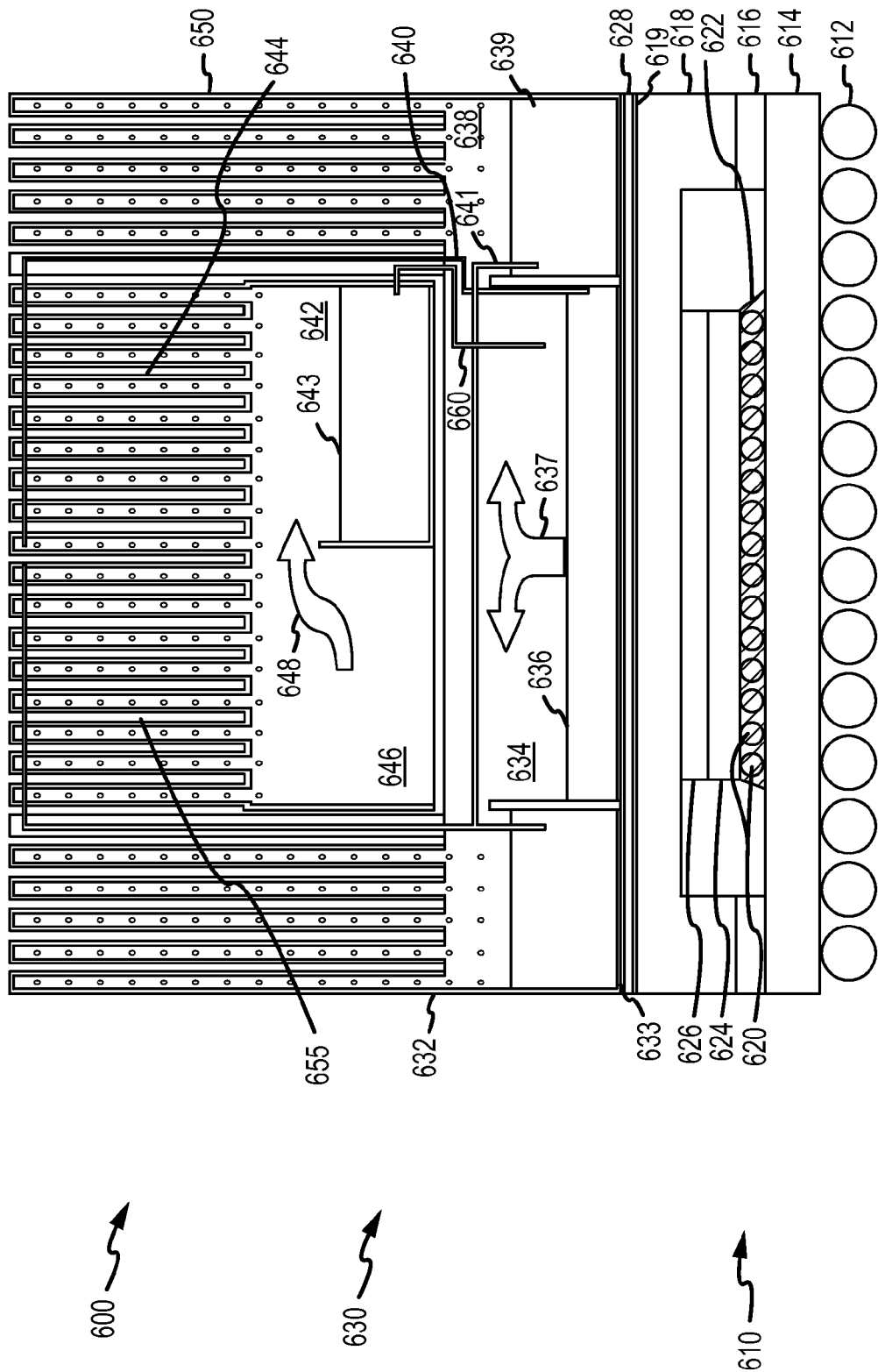
FIG. 6 is a schematic cross sectional view of a miniature, modular absorption heat sink device providing one exemplary configuration for the components for providing a passive and self-contained or unitary absorption refrigeration cycle-based device for cooling electronics equipment.

With this general understanding of an absorption heat sink understood (e.g., a passive cooling device with a pair of compartments at differing pressures connected by a pump(s) and with a heat exchanger for removing received/activation heat), it may be useful to describe a more specific embodiment showing more clearly components and fluid flow used to provide a heat sink of the invention. One exemplary thermal management system 600 is shown in FIG. 6. As shown, an absorption heat sink device 630 is mounted over an electronic component 610. FIG. 6 shows a schematic diagram of a heat-activated, absorption heat sink 630 that is typically miniature as the component 610 has small dimensions (e.g., dimensions associated with a CPU, ASIC, or similar device) and also may be modular and field removable for each installation and removal. Further, as discussed above, the device 630 may be unitary in that components for an absorption refrigeration cycle are provided within a single shell/housing 632. The component 610 may be a processor or other component for a server, and the heat sink device 630 may operate passively (e.g., without requiring power or control signals or the like) to provide cooling and thermal management of a high-heat server box. In addition to providing substantial heat removal ability, the embodiment 630 makes it possible to significantly reduce the amount of power needed to cool the electronic component 610 (e.g., a high power electronic component) in servers, data centers, and other systems/products when compared with other more conventional cooling practices.

FIG. 6 illustrates various components of the heat-activated, unitary, modular, field-removable, miniature, absorption heat sink device 600 attached to a high power processor 610 (e.g., a server processor as may be positioned on a board in a server box). The processor 610 may take a number of forms with the illustrated arrangement being only one example of a device with a heat generating surface (e.g., lid 618). As shown, the processor 610 includes a grid array 612 (such as a pin grid array (PGA), ball grid array (BGA), or the like) to conduct electrical signals from the integrated circuit/processor 610 to a printed circuit board (PCB) where it is placed or mounted for use. Upon this is provided a substrate 614, which then supports a circuit/bumps 620 and bump underfill 622 (i.e., the heat generating portion processing a load). A lid 618 is provided over the bumps 620 using adhesive 616 to attach it to the lower substrate 614. The lid 618 is typically formed of a metal or material with high heat conductivity such as copper, aluminum silicon carbide, or the like to efficiently transfer heat from the bumps 620 to a heat generating or dissipating surface 619 on lid 618. The lid 618 receives heat, in part, as it travels through a silicon layer 624 and a layer 626 of thermal interface material (TIM), which may be used to fill gaps between the thermal transfer surfaces of the silicon layer 614 and the lid 618 (and may be a thermal grease such as a silicone oil filled with metal fragments such as fragments of aluminum oxide, zinc oxide, boron nitride, and/or the like). Another layer of TIM 628 may be used to provide the heat transfer junction between the lid surface 619 and the bottom or contact surface 633 of the heat sink shell/housing 632. In some cases, of course, the bumps 620 are attached to the die, which is the heat generating portion of the electronic component. The lid 618 is then attached to the die through the layers 624, 626 (e.g., via the TIM 626). Heat generated in the die is dissipated through the TIM 626 to the lid 618 and then to the cooling system or heat sink assembly 630.

The heat sink assembly 630 utilizes heat from the lid 618 (or, more generally, the processor 610) to provide energy needed to drive a cooling refrigeration cycle or to provide absorption refrigeration to maintain a desired temperature of the surface 619. According to embodiments of the invention, heat generated by electronic components 610 such as processors, ASICs, FBDimms, and the like are used to drive the cooling cycle of the miniature absorption refrigeration system contained within the shell 632 of the heat sink 630. The absorption refrigeration system does not require any electricity to operate, and it acts as a passive refrigeration cooling system (i.e., no active motors or compressors, which may wear out or break down, as are provided in conventional dual-cycle refrigeration systems). As discussed with reference to FIG. 5, there are two compartments within the shell 632 an absorber compartment 642 and a generator compartment 634. Both compartments 642, 634 are designed and built to stay at sub-atmospheric pressures.

Heat input by the high power electronic component 610 via surface 633 of shell 632 acts to boil off absorbent or working absorbing liquid (e.g., concentrate solution of water and a salt) 636 in the generator compartment 634 causing the absorbent vapor 637 to move to a condenser portion 638 of the generator vessel of shell 632 as shown at 639 (and with the separation between the vessel shown by the solid wall in FIG. 6). Movement of cooling air (fan(s) not shown in FIG. 6) past the condenser air cooler 650 of the generator vessel portion of shell 632 condenses vapor to liquid form to be moved by gravity to the condenser portion 638 of the generator vessel/chamber 634 as shown as condenser liquid 639.

Migration of the condensate 639 using the passive bubble pump 641 to absorber vessel 642 at low pressures causes absorbent such as water to vaporize in the evaporator 646 as shown at 648 while passing through the evaporator air cooler/heat exchanger 655 of the absorber vessel 642. Similarly, migration of the concentrate absorbent 636 from the generator 634 to the absorber air cooler/heat exchanger 644 of the absorber vessel 642 using the condensate absorbent bubble pump 640 causes vaporization upon arrival at the lower pressure (e.g., down to about 1/10 or less of the pressure in the generator vessel 634) of the absorber compartment 642. Condensation of the water in the absorber vessel 642 as shown at 643 turns the concentrated absorbent to dilute solution in the absorber vessel 642. To complete the cycle, dilute solution 643 is then moved to the lower generator vessel 634 via return line 660. Hence, using an absorption refrigeration cycle, heat generated by the high power electronics component 610 is removed at the heat exchanger portions 644, 650 of the heat-activated, unitary, modular, field-removable, miniature, absorption heat sink device 630 to the incoming air that is driven by one or more fans past the electronics component 610.

It will be understood by those skilled in the art that during operation of the device 630, the generator portion 634 has two heat exchanges including "generator" and "condenser" exchanges and also the absorber portion 642 has two heat exchanges including "absorber" and "evaporator" exchanges. In use of the device 630, the condensate that moves from the condenser to the evaporator heat exchanger vaporizes, and the vapor is then condensed in the dilute absorbent to be pumped back to the generator using the bubble pump. Note, there are typically two pumps needed to move the concentrate and dilute absorbent solutions to and from the absorber. In general, the evaporator/absorber is at a lower pressure than the condenser/generator compartment(s), which can be a pressure differential designated by a ration of 10:1 (but a smaller or greater ratio may be used depending upon the design). The pressures of the two compartments or portions of the heat sink 630 are preferably sub-atmospheric. It is also interesting to note that the change in phase happens both due to change in pressure as well as movement of air through the condenser and evaporator heat exchangers. As a result, heat absorbed in the absorber is dissipated to the air through the heat exchanger fins of the heat sink unit 630.

Figure 7:
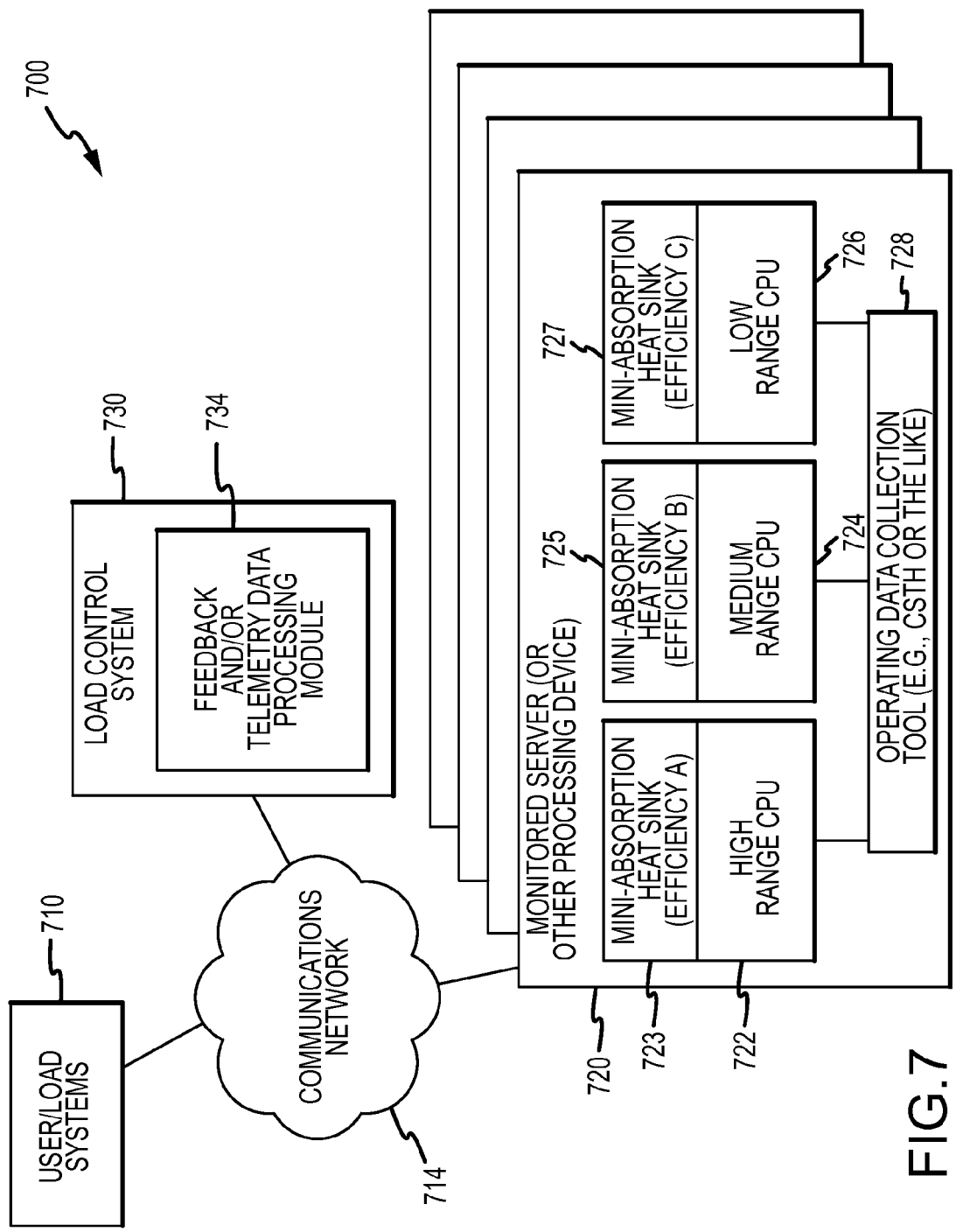
FIG. 7 is a functional block diagram of a thermal management system utilizing a plurality of absorption heat sinks with differing operating efficiencies or heat removal capacities for cooling electronic components dissipating differing levels of heat (or differing power dissipation requirements).

FIG. 7 illustrates a computer network/system 700 that may utilize absorption heat sink devices 723, 725, 727 to provide enhanced thermal management. As shown, a set of user systems or hosts 710 that create a processing load is included and connected via a digital communications network (such as the Internet, a LAN, a WAN, or the like) 714 to a monitored server (or other computer device) 720. The server 720 includes a number of processors and, in this embodiment, one is a high-range CPU 722, one is a medium-range CPU 724, and one is a low-range CPU 726 (e.g., a set of processors of differing heat dissipation requirements). Each of these processors may generate differing amounts of heat and/or be designed with differing operating temperatures. To meet these thermal management needs, three heat sinks 723, 725, 727 with differing sizes/designs are provided to remove heat and maintain temperatures of the processors 722, 724, 726 at a design temperature or within a preset range (that may differ for each processor or be the same throughout system 700). The heat sinks 723, 725, 727 may be designed to have optimal efficiencies based on a particular quantity of activation heat from a heat source such as a processor 722, 724, 726 and may be paired to the processor based on its expected heat generation.

Alternatively, as shown, the CPUs 722, 724, 726 are monitored with an operating data collection tool 728 (such as Sun Microsystems, Inc.'s continuous system telemetry harness (CSTH) or the like) to gather operating parameters and relay this information via network 714 to a load control system 730. This system 730 runs a feedback and/or telemetry data processing module 734 to process the telemetry or operating data from the tool 728, and, based on such monitoring, direct data processing requests or load from user systems 710 to the processors 722, 724, 726 to maintain the CPUs 722, 724, 726 at desired operating load. In this manner, the CPUs 722, 724, 726 are provided thermal management with passive cooling heat sinks 723, 725, 727 with the heat they generate operating the sinks 723, 725, 727 within a design operating range (at least a portion of the time).

As shown in the system 700, the synergistic integration of passive absorption heat sinks, as taught herein, with online monitoring and feedback (e.g., with CSTH telemetry) to provide intelligent load provisioning brings additional benefits. For example, CSTH technologies and techniques may be used in the system 700 as (or with some modifications) described in U.S. Pat. No. 7,020,802, entitled "Method and Apparatus for Monitoring and Recording Computer System Performance Parameters," which is incorporated herein in its entirety by reference. Load provisioning along with pairing differently "sized" (or heat removal capacity) heat sinks with appropriate processors (or heat sources providing differing amounts of activation heat for a refrigeration cycle) may allow operation at or near optimal overall energy efficiency for an enterprise computing landscape and especially a computing system characterized by widely varying load profiles. In one embodiment, individual mini-absorption heat sinks are provided that are designed with optimal efficiency at 3 utilization ranges for CPUs such as high, medium, and low processor utilization ranges. Intelligent scheduling or load provisioning (e.g., via CSTH or other similar products/tools) to preferentially load the high-range CPU(s) first and then spill over to the medium-range CPU(s), and then finally to the low-range CPU(s).

With this arrangement, an exemplary server with an average utilization of 20 percent would be able to achieve approximately 90 percent utilization (average) on its Tier-1 chips, 40 percent utilization (average) on its Tier-2 chips, and 10 percent utilization (average) on its Tier-3 chips. Overall efficiency levels are higher in a system in which the heat sinks are matched to the heat source/component than if the heat sink were optimized for some average or medium component, such as a medium utilization level which would result in suffering lower operating efficiencies when the cooled component (e.g., processor) generate more or less heat (e.g., for a data center where utilizations may more typically be higher than medium utilization or for processors supporting certain financial applications where average utilizations may be less than about 10 percent). The integrated method and system as shown in FIG. 7 for example may maintain near-optimal efficiency for user/load systems that create dynamic workload demand levels (e.g., 24 by 7 operations with loads peaking during a particular time of day (such as mid-day demand) but sagging during other times (such as off-shifts and weekends)).

According to aspects of the shown embodiments, aggressive thermal management of high heat flux server boxes is achievable using a heat-activated, unitary, modular, field-removable, miniature absorption heat sink device for cooling a heat-generating processor and/or other electronics components. To this end, the self-contained and easily removable unitary heat sink units may be provided in place of conventional heat sinks at desired locations over high power and heat generating components in a server box (or other electronics product housing or chassis). The miniature refrigeration absorption heat sink unit uses waste heat generated by the server processors and/or high heat generating components to drive the self-contained refrigeration system, which reduces the temperature of processors and electronic components to a desired level. Since the cooling device is heat driven, more heat is removed and, therefore, the heat sink device is able to maintain the processor or other electronic component's temperature a desired design level (such as 85° C., 95° C., or the lie) where convention cooling methods may have failed.

Absorbed heat is removed from the heat sink device by transferring it to incoming cooling air flowing through the air-cooled heat exchanger portion of the heat sink device (e.g., outer surfaces of the shell or housing that may include a plurality of cooling fins or other heat exchange surface). The heat is then released to ambient environment away from the electronics components over the board and out of the server box such as via an air outlet or vent in the box walls. The described heat sink devices may be used with or mated in heat transfer-contact with one or more heat generating devices/surfaces and act in a passive manner. Advantages provided by such a heat sink design include: an increase in on-demand thermal performance; reduction in overall cost of server or electronic product cooling; and continuance of relatively traditional air-cooling schemes for thermal management of high heat processors as the devices may be used to replace conventional heat sinks and used with existing cooling fans.

An exemplary but non-limiting purpose of the taught design is to provide a unique cooling method that may greatly improve the thermal management and reliability of high-powered electronics equipment such as processors, ASICs, and FBDimms using the cooling modules that provide absorption refrigeration cooling systems. A further listing of the advantages of the proposed design may be helpful. The heat sinks may provide high capacity passive refrigeration cooling that achieves a desirable thermal management solution to a wide range of thermal dissipation applications. Utilization of absorption technology provides very competitive cooling compared to the most effective active refrigeration systems with no electrical cost (e.g., simplifying circuitry inside the cooled electronics product) and with no motors/compressors to maintain or to break down. The application of the heat sink devices may dramatically improve thermal management of high-power computer servers by providing desired heat removal abilities that are tied to the heat generation of the processors/components within the server or other electronics product.

Further, the efficiency of passive absorption units is very high and is optimized per expected heat flux when the design capacity parameters are established. In one embodiment, three heat sinks of differing capacity/differing refrigeration cycle component design are provided that are optimized for high, medium, and low heat flux components (such CPUs). In this embodiment, preferential scheduling of load (such as via use of Sun Microsystems, Inc.'s CSTH technology or the like) to the high heat flux CPUs first with spillover load going to the medium heat-flux CPUs when utilization factors are high, and then to the low heat-flux CPUs infrequently (e.g., only during load-peaking time periods). This synergistic integration of new, passive absorption refrigeration units with intelligent provisioning of load will likely achieve optimal or at least improved overall energy efficiencies even when workload-utilization dynamics are highly variable.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A thermal management system for use in a computer network, comprising:
   a communications network;
   a server with a first processor operating to generate a quantity of heat and a second processor operating to generate a quantity of heat less than the quantity of heat generated by the first processor, wherein the server further comprises a first heat sink mounted on the first processor and a second heat sink mounted on the second processor;
   a data collection tool provided in the server operating to collect and transmit operating data for the first and second processors over the communications network; and
   a load control system linked to the communications network and running a load control module processing the transmitted operating data and provisioning load to the first and second processors to direct a greater amount of the provisioned load to the first processor than to the second processor,
   wherein the first and second heat sinks each comprises a passive absorption cooling system, with the cooling system of the first heat sink having a greater cooling capacity than the second heat sink;
   and wherein the heat sinks each comprise a shell with a generator vessel, an absorber vessel, and a bubble pump, the generator vessel containing a concentrate solution of water and salt, and the absorber vessel connected to the generator vessel via the bubble pump, wherein the bubble pump has an inlet in the generator vessel and an outlet in the absorber vessel.

2. The system of claim 1, wherein the quantities of heat generated by the first and second processors activate absorption refrigeration cycles within the first and second heat sinks.

3. The system of claim 1, wherein the generator vessels are positioned to receive the heat generated by the first and second processors and wherein the generator vessel is maintained at a pressure lower than ambient pressure and the absorber vessel is maintained at a pressure lower than the generator vessel pressure.

4. The system of claim 1, wherein the heat sinks each further comprises an air cooled heat exchanger extending over both of the generator and absorber vessels and wherein the bubble pump has an outlet in the heat exchanger within the absorber vessel.

5. The system of claim 4, wherein the generator vessel further comprises a condenser portion including a condenser basin receiving condensate from the air cooled heat exchanger and a bubble pump transferring a portion of the condensate into the heat exchanger within the absorber vessel for evaporation.

6. The system of claim 1, wherein the first processor comprises a high-range central processing unit (CPU) and the second processor comprises a medium range CPU.

7. A thermal management system, comprising:
a server with a first processor operating to generate a quantity of heat and with a second processor operating to generate a quantity of heat less than the quantity of heat generated by the first processor, wherein the server further comprises a first heat sink mounted on the first processor and a second heat sink mounted on the second processor;
a data collection tool collecting operating data for the first and second processors; and
a load control module processing the operating data and, in response, provisioning load to the first and second processors to direct a greater amount of the provisioned load to the first processor than to the second processor,
wherein the first and second heat sinks each comprises a passive absorption cooling system,
wherein the cooling system of the first heat sink has a greater cooling capacity than the cooling system of the second heat sink, and
wherein the quantities of heat generated by the first and second processors activate absorption refrigeration cycles within the first and second heat sinks;
and wherein the heat sinks each comprise a shell with a generator vessel, an absorber vessel, and a bubble pump, the generator vessel containing a concentrate solution of water and salt, and the absorber vessel connected to the generator vessel via the bubble pump, wherein the bubble pump has an inlet in the generator vessel and an outlet in the absorber vessel.

8. The system of claim 6, wherein the generator vessels are positioned to receive the heat generated by the first and second processors and wherein the generator vessel is maintained at a pressure lower than ambient pressure and the absorber vessel is maintained at a pressure lower than the generator vessel pressure.

9. The system of claim 7, wherein the heat sinks each further comprises an air cooled heat exchanger extending over both of the generator and absorber vessels and wherein the bubble pump has an outlet in the heat exchanger within the absorber vessel.

10. The system of claim 9, wherein the generator vessel further comprises a condenser portion including a condenser basin receiving condensate from the air cooled heat exchanger and a bubble pump transferring a portion of the condensate into the heat exchanger within the absorber vessel for evaporation.

11. The system of claim 7, wherein the first processor comprises a high-range central processing unit (CPU) and the second processor comprises a medium range CPU.

12. A thermal management system for use in a computer network, comprising: a communications network;
a server with a first processor operating to generate a quantity of heat and a second processor operating to generate a quantity of heat less than the quantity of heat generated by the first processor, wherein the server further comprises a first heat sink mounted on the first processor and a second heat sink mounted on the second processor;
a data collection tool provided in the server operating to collect and transmit operating data for the first and second processors over the communications network; and
a load control module processing the transmitted operating data and, based on the processing, provisioning load to the first and second processors to direct a greater amount of the provisioned load to the first processor than to the second processor,
wherein the quantities of heat generated by the first and second processors activate absorption refrigeration cycles within the first and second heat sinks, and
wherein the first processor comprises a high-range central processing unit (CPU) and the second processor comprises a medium range CPU;
and wherein the heat sinks each comprise a shell with a generator vessel, an absorber vessel, and a bubble pump, the generator vessel containing a concentrate solution of water and salt, and the absorber vessel connected to the generator vessel via the bubble pump, wherein the bubble pump has an inlet in the generator vessel and an outlet in the absorber vessel.

13. The system of claim 12, wherein the first and second heat sinks each comprises a passive absorption cooling system, with the cooling system of the first heat sink having a greater cooling capacity than the second heat sink.

14. The system of claim 10, wherein the generator vessels are positioned to receive the heat generated by the first and second processors.

15. The system of claim 10, wherein the generator vessel is maintained at a pressure lower than ambient pressure and the absorber vessel is maintained at a pressure lower than the generator vessel pressure.

16. The system of claim 10, wherein the heat sinks each further comprises an air cooled heat exchanger extending over both of the generator and absorber vessels and wherein the bubble pump has an outlet in the heat exchanger within the absorber vessel.

17. The system of claim 16, wherein the generator vessel further comprises a condenser portion including a condenser basin receiving condensate from the air cooled heat exchanger and a bubble pump transferring a portion of the condensate into the heat exchanger within the absorber vessel for evaporation.

* * * * *

UNITED STATES PATENT AND TRADEMARK OFFICE
CERTIFICATE OF CORRECTION

PATENT NO. : 8,474,275 B2
APPLICATION NO. : 13/602407
DATED : July 2, 2013
INVENTOR(S) : Heydari et al.

It is certified that error appears in the above-identified patent and that said Letters Patent is hereby corrected as shown below:

In the Claims

In column 15, line 42, In Claim 8, delete "claim 6" and insert -- claim 7, --, therefor.

In column 16, line 39, In Claim 14, delete "claim 10" and insert -- claim 12, --, therefor.

In column 16, line 42, In Claim 15, delete "claim 10" and insert -- claim 12, --, therefor.

In column 16, line 46, In Claim 16, delete "claim 10" and insert -- claim 12, --, therefor.

Signed and Sealed this
First Day of September, 2015

Michelle K. Lee
*Director of the United States Patent and Trademark Office*